United States Patent
Luo et al.

(10) Patent No.: US 9,985,244 B2
(45) Date of Patent: *May 29, 2018

(54) LIGHT EMITTING DISPLAY PANEL AND MANUFACTURING METHOD THEREOF

(71) Applicant: BOE Technology Group Co., Ltd., Beijing (CN)

(72) Inventors: Chengyuan Luo, Beijing (CN); Chun-jan Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/357,245

(22) Filed: Nov. 21, 2016

(65) Prior Publication Data

US 2017/0069869 A1 Mar. 9, 2017

Related U.S. Application Data

(63) Continuation of application No. 14/761,844, filed as application No. PCT/CN2014/087678 on Sep. 28, 2014, now Pat. No. 9,502,678.

(30) Foreign Application Priority Data

May 29, 2014 (CN) .......................... 2014 1 0235708

(51) Int. Cl.
  *H01L 33/00* (2010.01)
  *H01L 51/52* (2006.01)
  *H01L 51/56* (2006.01)

(52) U.S. Cl.
  CPC ........ *H01L 51/525* (2013.01); *H01L 51/5237* (2013.01); *H01L 51/5246* (2013.01);
  (Continued)

(58) Field of Classification Search
  CPC ........... H01L 2227/323; H01L 51/5237; H01L 51/5246; H01L 51/525; H01L 51/5259; H01L 51/56
  (Continued)

(56) References Cited

U.S. PATENT DOCUMENTS 7,279,063 B2 10/2007 Yokajty et al.
7,834,550 B2 * 11/2010 Lee ...................... H01L 51/5246
313/512

(Continued)

FOREIGN PATENT DOCUMENTS

CN 101287314 A 10/2008
CN 101477997 A 7/2009
(Continued)

OTHER PUBLICATIONS

Second Office Action, including Search Report, for Chinese Patent Application No. 201410235708.5, dated Sep. 1, 2016, 19 pages.
(Continued)

*Primary Examiner* — Mohammed Shamsuzzaman
(74) *Attorney, Agent, or Firm* — Westman, Champlin & Koehler, P.A.

(57) ABSTRACT

A light emitting display panel includes a cover plate and a substrate disposed opposite to each other; a plurality of light emitting devices located between the cover plate and the substrate; and a packaging structure surrounding the plurality of light emitting devices. The packaging structure includes at least three rows of protruded frames and a first packaging material which is located between adjacent protruded frames, each of the protruded frames having four sides which are looped and the at least three rows of protruded frames being adjacent to and embedded into each other in an outward direction. The packaging structure further includes a third packaging material which is located
(Continued)

between the cover plate and the substrate, and located outside the outermost one of the at least three rows of protruded frames and inside the innermost one of the at least three rows of protruded frames.

7 Claims, 5 Drawing Sheets

(52) U.S. Cl.
CPC .......... *H01L 51/5259* (2013.01); *H01L 51/56* (2013.01); *H01L 2227/323* (2013.01)

(58) Field of Classification Search
USPC ........... 257/99; 438/29, 16; 445/25; 313/512
See application file for complete search history.

(56) References Cited

U.S. PATENT DOCUMENTS

| | | | | |
|---|---|---|---|---|
| 7,837,530 | B2* | 11/2010 | Park | H01L 51/5246 445/24 |
| 8,063,561 | B2* | 11/2011 | Choi | H01L 51/5246 313/500 |
| 8,299,705 | B2* | 10/2012 | Choi | H01L 51/5246 313/512 |
| 8,357,929 | B2 | 1/2013 | Ryu et al. | |
| 8,405,309 | B2* | 3/2013 | Lee | H01J 9/241 313/504 |
| 8,568,184 | B2* | 10/2013 | Prest | H01L 51/5237 313/512 |
| 8,710,736 | B2 | 4/2014 | Ryu et al. | |
| 8,883,527 | B2* | 11/2014 | Wu | H01L 27/3258 438/26 |
| 9,013,099 | B2 | 4/2015 | Wang et al. | |
| 9,502,678 | B2* | 11/2016 | Luo | H01L 51/5237 |
| 2003/0122476 | A1 | 7/2003 | Wang et al. | |
| 2006/0033433 | A1* | 2/2006 | Carr | B01J 20/041 313/546 |
| 2007/0173167 | A1* | 7/2007 | Choi | H01L 51/5246 445/25 |
| 2007/0197120 | A1* | 8/2007 | Lee | C03C 8/24 445/25 |
| 2010/0089636 | A1* | 4/2010 | Ramadas | B82Y 15/00 174/521 |
| 2010/0258346 | A1 | 10/2010 | Chen et al. | |
| 2011/0132449 | A1* | 6/2011 | Ramadas | H05B 33/04 136/256 |
| 2012/0056890 | A1* | 3/2012 | Mignard | G02B 26/001 345/501 |
| 2012/0064278 | A1 | 3/2012 | Chen | |
| 2013/0221841 | A1 | 8/2013 | Moriwaki | |
| 2014/0118947 | A1 | 5/2014 | Chen et al. | |
| 2014/0118975 | A1 | 5/2014 | Chen et al. | |
| 2015/0132876 | A1* | 5/2015 | Shin | H01L 51/5275 438/29 |
| 2015/0160402 | A1* | 6/2015 | Kim | B29D 11/00663 362/613 |
| 2016/0013440 | A1* | 1/2016 | Luo | H01L 51/5246 257/40 |
| 2016/0020259 | A1 | 1/2016 | Cheng et al. | |

FOREIGN PATENT DOCUMENTS

| | | | | |
|---|---|---|---|---|
| CN | 101847650 A | * | 9/2010 | ......... H01L 51/5246 |
| CN | 101866584 A | | 10/2010 | |
| CN | 201946636 U | | 8/2011 | |
| CN | 102420239 A | | 4/2012 | |
| CN | 102664239 A | | 9/2012 | |
| CN | 102983290 A | | 3/2013 | |
| CN | 103426896 A | * | 12/2013 | ......... H01L 51/5246 |
| CN | 103474582 A | | 12/2013 | |
| CN | 104037196 A | | 9/2014 | |
| TW | 200733792 A | | 9/2007 | |

OTHER PUBLICATIONS

First Office Action for Chinese Patent Application No. 201410235708.5, dated Mar. 31, 2015, 15 pages.
International Search Report and Written Opinion for International Application No. PCT/CN2014/087678, dated Feb. 26, 2015, 10 pages.
Prosecution documents issued by the U.S. Patent Office in connection to U.S. Appl. No. 14/767,844, filed Jul. 17, 2015, including: Notice of Allowance dated Jul. 11, 2016, 13 pages; Non-Final Rejection dated Mar. 3, 2016, 14 pages; and Requirement for Restriction/Election dated Dec. 17, 2015, 7 pages; 34 pages total.
Extended European search report for European Patent Application No. 14882177.0-1211, dated Feb. 1, 2018, 10 pages.

* cited by examiner

LIGHT EMITTING DISPLAY PANEL AND MANUFACTURING METHOD THEREOF

CROSS-REFERENCE TO RELATED APPLICATIONS

This application is a continuation of U.S. application Ser. No. 14/761,844, filed on Jul. 17, 2015, scheduled to issue into U.S. Pat. No. 9,502,678, on Nov. 22, 2016, which is a Section 371 National Stage Application of International Application No. PCT/CN2014/087678, filed 28 Sep. 2014, entitled "SIGNAL FREQUENCY SETTING DEVICE AND METHOD FOR TIME SCHEDULE CONTROLLER AND DISPLAY DEVICE, which has not yet published, which claims priority to Chinese Application No. 201410235708.5, filed on 29 May 2014, incorporated herein by reference in their entirety.

BACKGROUND OF THE INVENTION

Field of the Invention

Embodiments of the present disclosure relate to a technical field of electronic components, in particular, to a light emitting display panel and a manufacturing method thereof.

Description of the Related Art

An OLED device refers to such an electroluminescent device that is formed of an organic semiconductor material and a luminous material and is caused to emit light through injection and recombination of carriers upon it being driven by an electric field. OLED devices have many advantages and possess bright prospects in the field of display. OLED devices are very sensitive to water vapor and oxygen gas, and water vapor and oxygen gas that permeate into OLED devices are main factors that affect lifetime of the OLED devices. Thus, OLED devices are usually packaged by a packaging structure so as to prevent the water vapor and oxygen gas permeating.

In the prior art, a common packaging structure is to package the OLED devices using resin adhesive. However, water vapor and oxygen gas would permeate into the OLED devices through the packaging adhesive when only the resin adhesive is used to package. In addition, a distance from an outer edge of the adhesive to OLED is typically increased in order to improve an effect of preventing water vapor and oxygen gas, but widening a region of adhesive may only be conducted in a plane in the traditional OLED substrate and cover plate, thereby this will increase an area of non-luminous region, which is disadvantaged to realize a manufacture of narrow bezel display panel. Another common packaging structure is to package the OLED devices using glass cement which may achieve an excellent packaging effect. However, laser is needed during curing the glass cement and it may damage the OLED layer. Moreover, if only the glass cement is used to package the OLED devices, manufacture of large-size OLED devices cannot be achieved because a glass plate would collapse in its central portion.

SUMMARY OF THE INVENTION

To this end, embodiments of the present disclosure provide a light emitting display panel in order to prolong an invasion path of the water vapor and oxygen gas and to increase an effect of preventing the water vapor and oxygen gas, lifetime of the OLED devices is thus prolonged.

According to one aspect of the present disclosure, it is provided a light emitting display panel comprising:

a cover plate and a substrate disposed opposite to each other;

a plurality of light emitting devices located between the cover plate and the substrate; and a packaging structure surrounding the plurality of light emitting devices;

wherein the packaging structure comprising at least three rows of protruded frames and a first packaging material which is located between adjacent protruded frames, each of the protruded frames having four sides which are looped and the at least three rows of protruded frames being adjacent to and embedded into each other in an outward direction, and adjacent ones of the at least three rows of protruded frames are alternately disposed on the cover plate and the substrate and protruding in opposite directions, and non-adjacent ones of the at least three rows of protruded frames are disposed on the same one of the cover plate and the substrate and protruding in the a same direction; and wherein the packaging structure further comprises a third packaging material which is located between the cover plate and the substrate, and located outside the outermost one of the at least three rows of protruded frames and inside the innermost one of the at least three rows of protruded frames.

In an embodiment, the light emitting display panel further comprises a circuit structure of the plurality of light emitting devices, the circuit structure has an inorganic portion and an organic portion, and the circuit structure extends from underneath the protruded frames disposed on the substrate to an exterior of the packaging structure and the protruded frames underneath which the circuit structure extends from are disposed on an inorganic portion of the circuit structure.

In an embodiment, the light emitting display panel further comprises a circuit structure of the plurality of light emitting devices, the circuit structure being paved on a convex surface of the protruded frames disposed on the substrate and extending to an exterior of the packaging structure, and wherein each of the convex surfaces of the protruded frames is a surface with a certain radian.

In an embodiment, the first packaging material comprises desiccant, and the third packaging material comprises UV curing and/or thermal curing resin adhesive.

In an embodiment, the protruded frames include glass material.

In an embodiment, non-adjacent two rows of the at least three rows of protruded frames disposed on one of the cover plate and the substrate have the same height, and another row of the at least three rows of protruded frames, which is disposed on the other one of the cover plate and the substrate and disposed between the non-adjacent two rows in the outward direction, has a height less than the height of non-adjacent two rows, and the another row is spaced from both the non-adjacent two rows in the outward direction.

In an embodiment, each of the at least three rows of protruded frames has a height of 10 μm to 100 μm and a width of 10 μm to 50 μm.

In an embodiment, the number of the protruded frames is 2N+1, and wherein the number of the protruded frames disposed on the cover plate is N+1 and the number of the protruded frames disposed on the substrate is N, or wherein the number of the protruded frames disposed on the cover plate is N and the number of the protruded frames disposed on the substrate is N+1, wherein N is a natural number.

According to another aspect of the present disclosure, it is provided a manufacturing method of a light emitting display panel, the light emitting display panel comprising a cover plate and a substrate disposed opposite to each other, a plurality of light emitting devices located between the cover plate and the substrate, and a packaging structure surrounding the plurality of light emitting devices; wherein the manufacturing method comprises steps of:

forming a first portion of the packaging structure on the cover plate and forming a second portion of the packaging structure on the substrate, wherein the first portion is formed as at least two rows of protruded frames, with each having looped four sides and having a certain gap therebetween, and the second portion is formed as at least one row of protruded frame with looped four sides; or wherein the second portion is formed as at least two rows of protruded frames, with each having looped four sides and having a certain gap therebetween, and the first portion is formed as at least one row of protruded frame with looped four sides;

filling a first packaging material between the at least three rows of protruded frames;

filling a third packaging material outside the outermost one of the at least three rows of protruded frames and inside the innermost one of the at least three rows of protruded frames after filling the first packaging material between the at least three rows of protruded frames; and pressing and assembling the cover plate and the substrate so that the at least three rows of protruded frames of the packaging structure are adjacent to and embedded into each other in an outward direction.

In an embodiment, the forming a second portion of the packaging structure on the substrate comprises:

manufacturing a circuit structure of the plurality of light emitting devices on an upper surface of the substrate, the circuit structure having an inorganic portion and an organic portion;

coating glass cement on the periphery of the upper surface of the substrate on which the inorganic portion of the circuit structure is manufactured;

curing the glass cement with laser to form at least one row or two rows of protruded frames, with each having looped four sides.

In an embodiment, the forming a second portion of the packaging structure on the substrate comprises:

forming integrally at least one row or two rows of protruded frames, with each having looped four sides, on the substrate;

paving a circuit structure of the plurality of light emitting devices on a convex surface of the at least one row or two rows of protruded frames and extending it to an exterior of the packaging structure.

In an embodiment, the first packaging material comprises desiccant, and the third packaging material comprises UV curing and/or thermal curing resin adhesive.

In an embodiment, non-adjacent two rows of the at least three rows of protruded frames disposed on one of the cover plate and the substrate have the same height, and another row of the at least three rows of protruded frames disposed on the other one of the cover plate and the substrate and disposed between the non-adjacent two rows in the outward direction has a height less than the height of non-adjacent two rows, and the another row is spaced from both the non-adjacent two rows in the outward direction.

Embodiments of the present disclosure achieve an effect of prolonging an invasion path of the water vapor and oxygen gas spatially and thus increasing an effect of preventing the water vapor and oxygen gas by forming at least two rows of protruded frames on a cover plate of liquid crystal display panel and forming a row of protruded frame on a substrate correspondingly which can be embedded between the at least two rows of protruded frames on the cover plate and by filling resin adhesive or desiccant in gaps between these frames.

DETAILED DESCRIPTION OF PREFERRED EMBODIMENTS OF THE INVENTION

In order to make objectives, technical solutions and advantages of the embodiments of the invention more clear and apparent, hereinafter, the technical solutions of the invention will be described in detail in connection with the specific embodiments and referring to the accompanying drawings.

Embodiments of the invention provide a light emitting display panel. The light emitting display panel comprises a cover plate and a substrate disposed opposite to each other, a plurality of light emitting devices located between the cover plate and the substrate, and a packaging structure surrounding the light emitting devices. The packaging structure comprises at least three rows of protruded frames and a first packaging material which is located between adjacent protruded frames, wherein four sides of each of the protruded frames are looped and the at least three rows of protruded frames are adjacent to and embedded in each other in an outward direction. Adjacent ones of the at least three rows of protruded frames are alternately disposed on the cover plate and the substrate and protrude in opposite directions, and non-adjacent ones of the at least three rows of protruded frames are disposed on the same one of the cover plate and the substrate and protrude in the same direction. In the embodiments of the present disclosure, the outward direction is a direction from an inside of a part enclosed by the packaging structure to an outside thereof.

Figure 1:
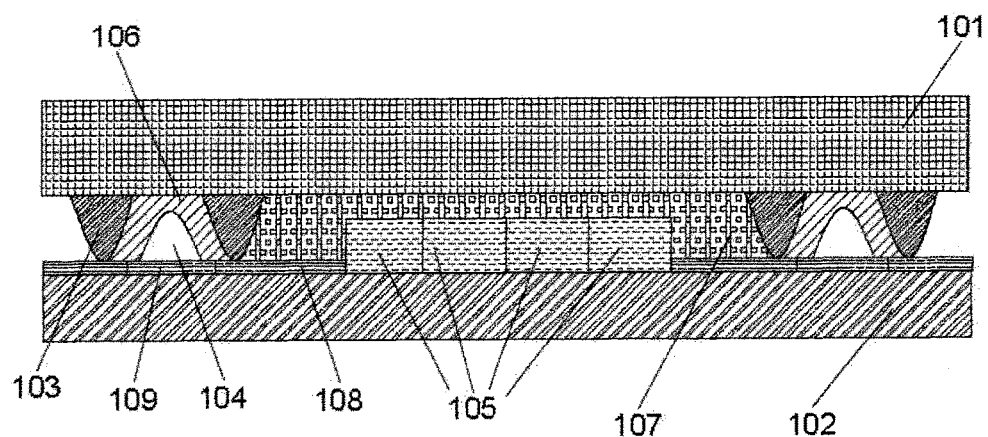
FIG. 1 is a structural schematic view of a light emitting display panel according to an embodiment of the present disclosure.

FIG. 1 is a structural schematic view of a light emitting display panel according to an embodiment of the present disclosure. As shown in FIG. 1, the light emitting display panel comprises a cover plate 101 and a substrate 102 disposed opposite to each other, a plurality of light emitting devices 105 located between the cover plate and the substrate, and a packaging structure surrounding the light emitting devices 105. The packaging structure comprises at least three rows of protruded frames and a first packaging material 106 which is located between protruded frames, wherein four sides of each of the protruded frames are looped and the at least three rows of protruded frames are embedded in each other in an outward direction. The at least three rows of protruded frames comprise at least two rows of first protruded frames 103 with a certain gap therebetween disposed on a lower surface of the cover plate 101 and at least one row of second protruded frame 104 disposed on an upper surface of the substrate 102. The second protruded frame 104 is embedded between the at least two rows of first protruded frames 103. And the cover plate and the substrate are sealed at the protruded frames by packaging material. The plurality of light emitting devices 105 are located in an interior region of the second protruded frame 104. Adjacent ones of the at least three rows of protruded frames are alternately disposed on the cover plate and the substrate and protrude in opposite directions, and non-adjacent ones of the at least three rows of protruded frames are disposed on the same one of the cover plate and the substrate and protrude in the same direction.

Figure 3:
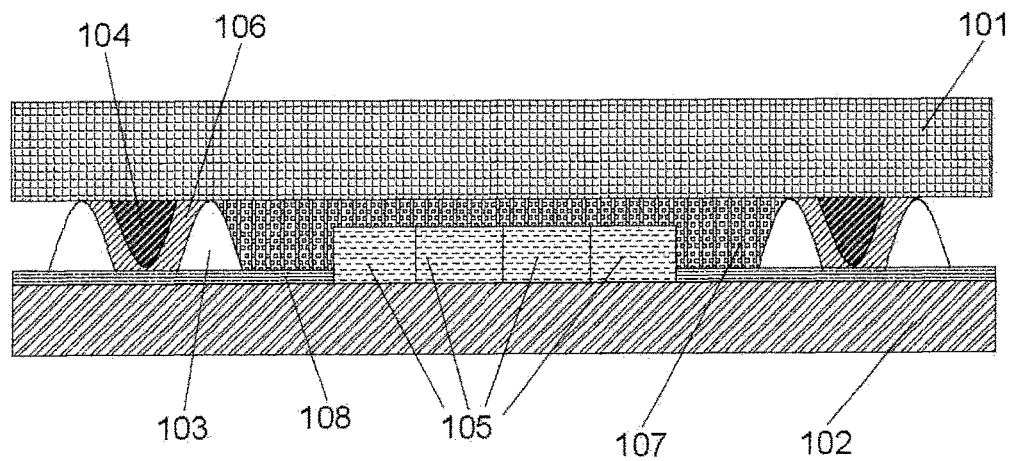
FIG. 3 is a structural schematic view of a light emitting display panel in which two rows of protruded frames are disposed on a substrate and one row of protruded frame is disposed on a cover plate.

Alternatively, the at least two rows of first protruded frames 103 may also be disposed on the substrate 102 and the at least one row of second protruded frame 104 may also be disposed on the cover plate 101, as shown in FIG. 3.

Optionally, convex surfaces of the first protruded frames 103 and/or the second protruded frame 104 may be formed as any shape, preferably, as a surface having a certain radian with a range of 0.52 rad to 1.57 rad.

Optionally, a second packaging material 107 may also be filled inside the innermost one of the at least two rows of first protruded frames 103 and filled in gaps between the cover plate and the substrate.

Optionally, the first packaging material 106 and the second packaging material 107 may be transparent packaging material with low water permeability, such as UV curing and thermal curing resin adhesive. The UV curing adhesive includes light-sensitive resin, such as homopolymer or copolymer of monomer, for example, epoxy resin, glycidyl acrylate, glycidyl methacrylate, methyl methacrylate, ethyl methacrylate, n-butyl methacrylate, metacrylic acid-6,7-epoxy-heptyl ester, 2-hydroxyethyl methacrylate, etc. The thermal curing adhesive includes melamine-formaldehyde resin, unsaturated polyester resin, organic silicon resin, furan resin, etc. The first packaging material 106 is preferably the material with a high viscosity (100000-400000 mPa·s) and the second packaging material 107 is preferably the material with a low viscosity (100-2000 mPa·s).

Alternatively, the cover plate 101 and the substrate 102 may be formed from glass or quartz, etc.

Optionally, the second protruded frame 104 is formed before manufacturing the plurality of light emitting devices 105.

Optionally, the first protruded frames 103 and the second protruded frame 104 are formed by curing the glass cement with laser, that is, they contain glass material.

Optionally, the first protruded frames 103 are formed integrally while the cover plate is formed, or formed by coating and curing the glass cement after forming the cover plate.

Optionally, as shown in FIG. 1, a circuit structure 108 of the plurality of light emitting devices 105 is further formed on the substrate 102, and the circuit structure 108 extends from underneath the protruded frames disposed on the substrate to an exterior of the packaging structure.

Figure 4:
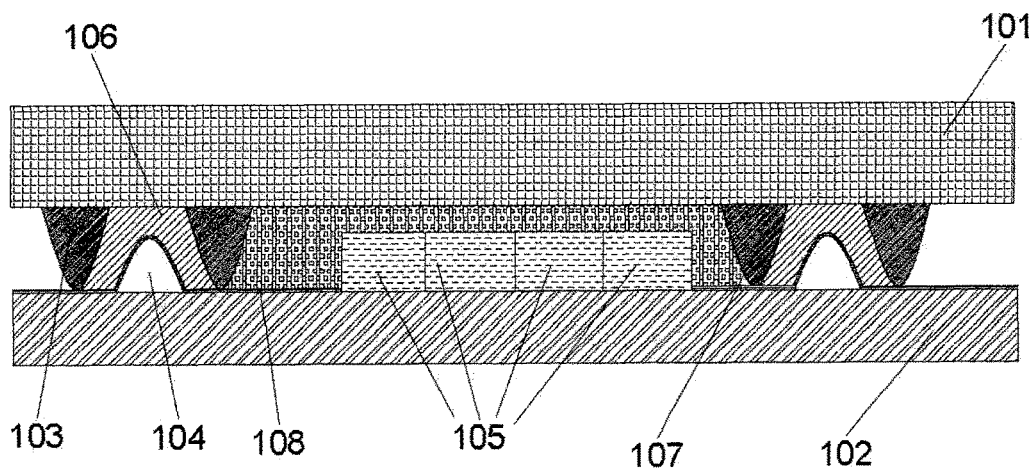
FIG. 4 is a structural schematic view of a light emitting display panel showing another arrangement of a circuit structure.

Alternatively, as shown in FIG. 4, a circuit structure 108 of the plurality of light emitting devices 105 is further formed on the substrate 102, and the circuit structure is paved on the convex surfaces of the protruded frames disposed on the substrate and extends to an exterior of the packaging structure, so as to facilitate lightening the plurality of light emitting devices 105 by an external power supply.

Optionally, the second protruded frame 104 may be formed while the substrate is formed, that is, before the circuit structure of the plurality of light emitting devices is formed, or may be formed after the circuit structure of the plurality of light emitting devices is formed. If the latter and the second protruded frame 104 is formed from glass cement, since an organic portion of the circuit structure of the plurality of light emitting devices may be damaged during curing the glass cement with laser, it is necessary to try to avoid the organic portion of the circuit structure of the plurality of light emitting devices and to form the second protruded frame 104 on an inorganic portion 109 thereof. The organic portion of the circuit structure of the plurality of light emitting devices includes a metal electrode, an ITO electrode, etc.

Optionally, in the embodiments of the present disclosure, non-adjacent two rows of the at least three rows of protruded frames disposed on one of the cover plate and the substrate have the same height, and another row of the at least three rows of protruded frames, which is disposed on the other one of the cover plate and the substrate and disposed between the non-adjacent two rows in the outward direction, has a height less than the height of non-adjacent two rows, and the another row is spaced from both the non-adjacent two rows in the outward direction. Specifically, each of the first protruded frames 103 and the second protruded frame 104 has a height of 10 μm to 100 μm and a width of 10 μm to 50 μm. Moreover, the two rows of first protruded frames 103 have the same height and the second protruded frame 104 has a height less than the height of the first protruded frames 103, in order to prevent granules from producing during pressing and assembling the first and second protruded frames and to reserve space for the first packaging material 106 between the first protruded frames 103 and the second protruded frame 104.

Optionally, the first protruded frames 103 have more than two rows and are in a spaced distribution. The second protruded frames 104 have more than one row and the number thereof is one less than the number of the first protruded frames 103. In other words, the number of the second protruded frames 104 is N if the number of the first protruded frames 103 is N+1, wherein N is a natural number. The bigger the number of the first protruded frames 103 and the second protruded frames 104 is, the better a packaging effect is, obviously, the larger an area occupied by the protruded frames is. Thus, the number of the protruded frames may be suitably selected according to an actual requirement during the manufacture process.

The circuit structure of the light emitting devices needs to extend from the light emitting devices to the exterior of the packaging structure and the light emitting devices is lightened by the external power supply, thus the circuit structure needs to be paved on the convex surface of the second protruded frames 104 if it is manufactured after the second protruded frames 104 is formed, as shown in FIG. 4. The convex surface of the second protruded frames 104 is preferably formed as a curved surface if the circuit structure is paved thereon because the curved surface has a smoother transition and may prevent the circuit from opening. The light emitting devices are OLED light emitting devices.

Figure 2:
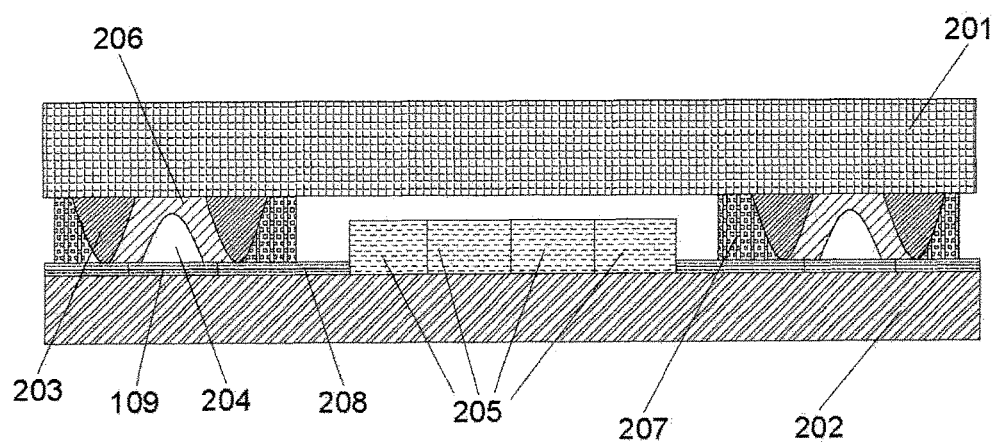
FIG. 2 is a structural schematic view of a light emitting display panel according to another embodiment of the present disclosure.

FIG. 2 is a structural schematic view of a light emitting display panel according to another embodiment of the present disclosure. As shown in FIG. 2, the light emitting display panel comprises a cover plate 201 and a substrate 202 disposed opposite to each other, a plurality of light emitting devices 205 located between the cover plate and the substrate, and a packaging structure surrounding the light emitting devices 205. The packaging structure comprises at least three rows of protruded frames and a first packaging material 206 which is located between adjacent protruded frames, wherein four sides of each of the protruded frames are looped and the at least three rows of protruded frames are adjacent to and embedded in each other in an outward direction. The at least three rows of protruded frames comprise at least two rows of first protruded frames 203 with a certain gap therebetween disposed on a lower surface of the cover plate 201 and at least one row of second protruded frame 204 disposed on an upper surface of the substrate 202. The second protruded frame 204 is embedded between the at least two rows of first protruded frames 203. And the cover plate and the substrate are sealed at the protruded frames by packaging material. The plurality of light emitting devices 205 are located in an interior region of the second protruded frame 204.

Alternatively, the at least two rows of first protruded frames 203 may also be disposed on the substrate 202 and the at least one row of second protruded frame 204 may also be disposed on the cover plate 201.

Wherein, a third packaging material 207 is coated both outside an outer one of the at least two rows of first protruded frames 203 and inside an inner one thereof.

Optionally, the first packaging material 206 may be desiccant, and the third packaging material 207 may be transparent packaging material with low water permeability, such as UV curing and/or thermal curing resin adhesive.

Optionally, the desiccant may be selected as a material which can react with water and oxygen, for example, a combination of one or more of calcium oxide, barium oxide, magnesium oxide and zinc oxide. The desiccant may not only prevent water vapor from invading, but also improve the packaging effect while keeping a smaller bezel, because an invasion path of water vapor is prolonged spatially when the first protruded frames 203 and the second protruded frame 204 are assembled upward and downward.

In the embodiment as shown in FIG. 2, a circuit structure 208 of the plurality of light emitting devices 205 is formed on the substrate 202, and the circuit structure 208 extends from underneath the protruded frames disposed on the substrate to an exterior of the packaging structure.

The details of this embodiment are the same as that of the above embodiment and are not explained here.

In addition, the packaging structure may also comprise all the first, second and third packaging material. Specifically, the first packaging material is disposed between the protruded frames, the second packaging material is disposed inside the innermost one of the at least three rows of protruded frames and filled in gaps between the cover plate and the substrate, and the third packaging material is disposed outside the outermost one of the at least three rows of protruded frames.

Embodiments of the present disclosure further provide a manufacturing method of a light emitting display panel, wherein the light emitting display panel comprises a cover plate and a substrate disposed opposite to each other, a plurality of light emitting devices located between the cover plate and the substrate, and a packaging structure surrounding the plurality of light emitting devices; and the manufacturing method comprises steps of:

forming a first portion of the packaging structure on the cover plate and forming a second portion of the packaging structure on the substrate, wherein the first portion is formed as at least two rows of protruded frames, with each having looped four sides and having a certain gap therebetween, and the second portion is formed as at least one row of protruded frame with looped four sides; or wherein the second portion is formed as at least two rows of protruded frames, with each having looped four sides and having a certain gap therebetween, and the first portion is formed as at least one row of protruded frame with looped four sides;

filling a first packaging material between the at least two rows of protruded frames;

pressing and assembling the cover plate and the substrate so that the at least three rows of protruded frames of the packaging structure are adjacent to and embedded into each other in an outward direction.

Figure 5:
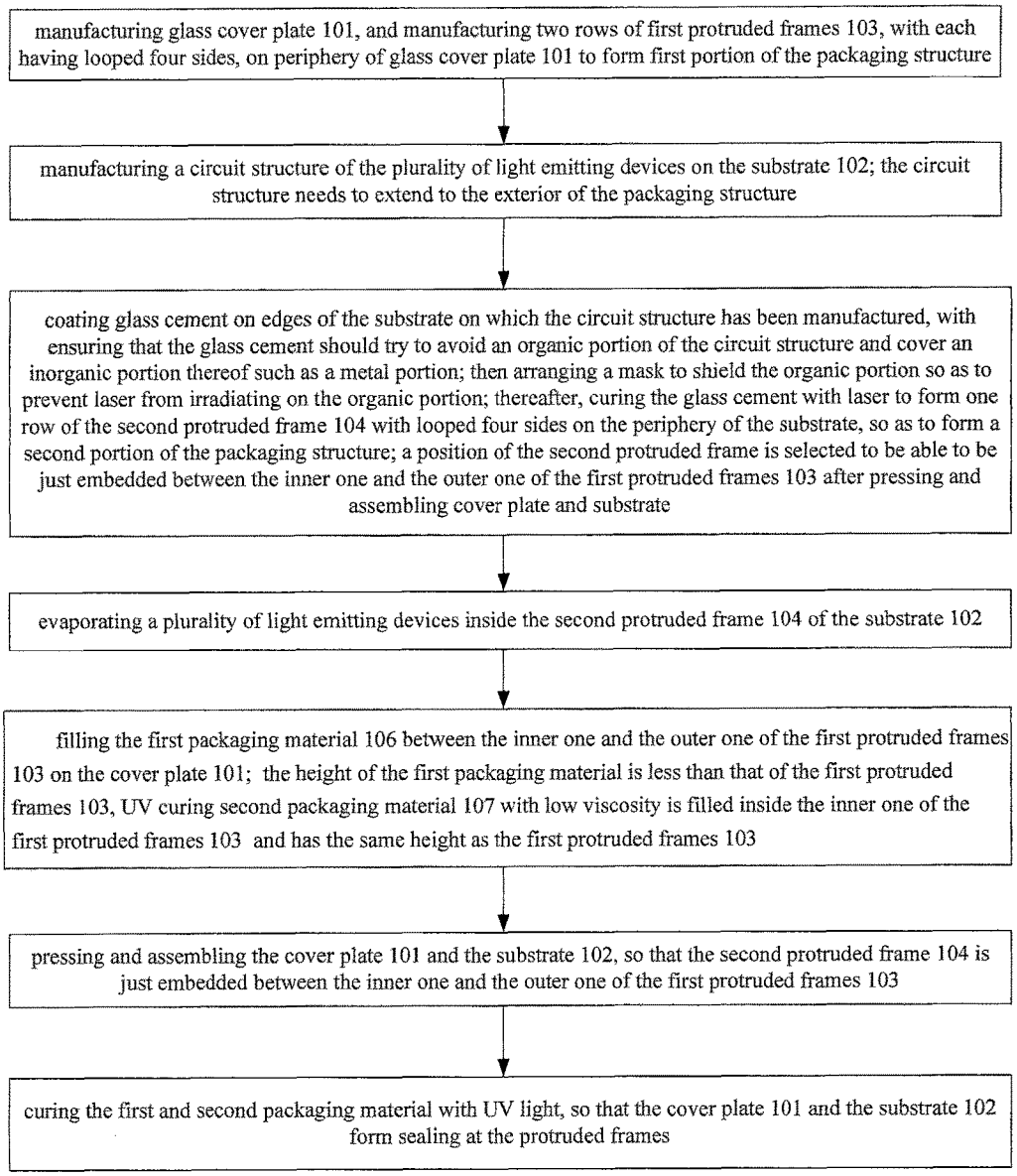
FIG. 5 is a flow chart of a manufacturing method of a light emitting display panel according to an embodiment of the present disclosure.

FIG. 5 is a flow chart showing a manufacturing method of the light emitting display panel according to an embodiment of the present disclosure. As shown in FIG. 5, the manufacturing method comprises steps of:

Step S301. manufacturing a glass cover plate 101, and manufacturing two rows of first protruded frames 103, with each having looped four sides, on the periphery of the glass cover plate 101 to form a first portion of the packaging structure.

In the step S301, alternatively, both an inner one and an outer one of the first protruded frames 103 have a width of 30 μm, a height of 50 μm and a gap of 20 μm. The first protruded frames 103 may be formed integrally with the glass cover plate 101, or may also be formed by coating glass cement and then curing it with laser.

Step S302. manufacturing a circuit structure of the plurality of light emitting devices on the substrate 102.

Wherein the circuit structure needs to extend to the exterior of the packaging structure and an output electrode thereof is formed from metal such as aluminum, magnesium, silver, etc.

Step S303. coating glass cement on edges of the substrate on which the circuit structure has been manufactured, with ensuring that the glass cement should try to avoid an organic portion of the circuit structure and cover an inorganic portion thereof such as a metal portion; then arranging a mask to shield the organic portion so as to prevent laser from irradiating on the organic portion; thereafter, curing the glass cement with laser to form one row of the second protruded frame 104 with looped four sides on the periphery of the substrate, so as to form a second portion of the packaging structure.

In the step S303, a position of the second protruded frame 104 is selected to be able to be just embedded between the inner one and the outer one of the first protruded frames 103 after the substrate and the cover plate are pressed and assembled. Alternatively, the second protruded frame 104 has a height of 30 μm and a width of 20 μm.

Step S304. forming a plurality of light emitting devices inside the second protruded frame 104 of the substrate 102.

Step S305. filling the first packaging material 106 between the inner one and the outer one of the first protruded frames 103 of the cover plate 101.

In the step S305, the height of the first packaging material is less than that of the first protruded frames 103, a UV curing second packaging material 107 with low viscosity is filled inside the inner one of the first protruded frames 103 and has the same height as the first protruded frames 103.

Step S306. pressing and assembling the cover plate 101 and the substrate 102, so that the second protruded frame 104 is just embedded between the inner one and the outer one of the first protruded frames 103.

Step S307. curing the first and second packaging material with UV light, so that the cover plate 101 and the substrate 102 form sealing at the protruded frames.

Obviously, in the above method, one row of the second protruded frame 104 may also be manufactured on the cover plate and two rows of the first protruded frames 103 may also be manufactured on the substrate.

Figure 6:
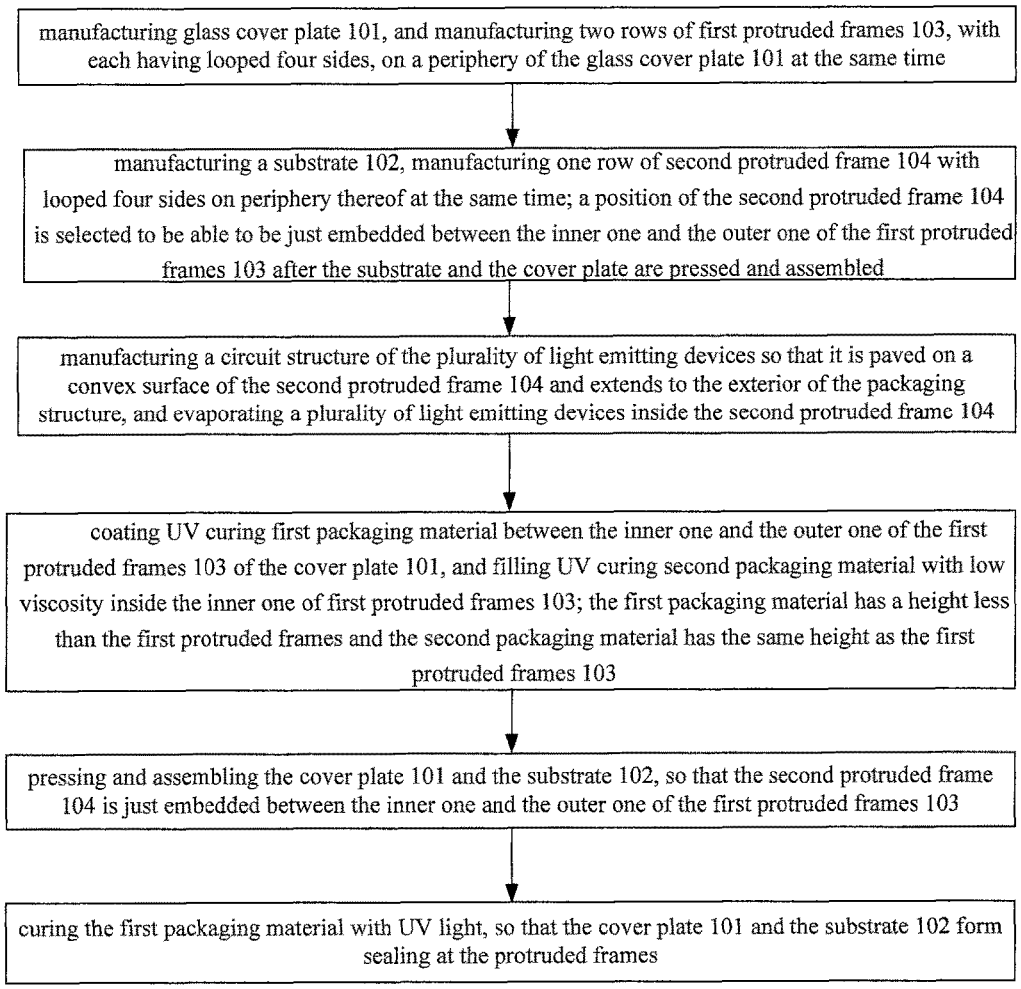
FIG. 6 is a flow chart of a manufacturing method of a light emitting display panel according to another embodiment of the present disclosure.

FIG. 6 is a flow chart showing a manufacturing method of the light emitting display panel according to another embodiment of the present disclosure. As shown in FIG. 6, the manufacturing method comprises steps of:

Step S401. manufacturing a glass cover plate 101, and manufacturing two rows of first protruded frames 103, with each having looped four sides, on the periphery of the glass cover plate 101 at the same time.

In the step S401, both an inner one and an outer one of the first protruded frames 103 have a width of 50 μm, a height of 60 μm and a gap of 20 μm.

Step S402. manufacturing a substrate 102, and manufacturing one row of second protruded frame 104 with looped four sides on the periphery thereof at the same time.

In the step S402, a position of the second protruded frame 104 is selected to be able to be just embedded between the inner one and the outer one of the first protruded frames 103 after the substrate and the cover plate are pressed and assembled. Wherein, the second protruded frame 104 has a height of 50 μm and a width of 15 μm.

Step S403. manufacturing a circuit structure of the plurality of light emitting devices so that it is paved on a convex surface of the second protruded frame 104 and extends to the exterior of the packaging structure, and forming a plurality of light emitting devices inside the second protruded frame 104.

Step S404. coating a UV curing first packaging material between the inner one and the outer one of the first protruded frames 103 of the cover plate 101, and filling a UV curing second packaging material with a low viscosity inside the inner one of the first protruded frames 103.

In the step S404, the first packaging material has a height less than the first protruded frames 103 and the second packaging material has the same height as the first protruded frames 103.

Step S405. pressing and assembling the cover plate 101 and the substrate 102, so that the second protruded frame 104 is just embedded between the inner one and the outer one of the first protruded frames 103.

Step S406. curing the first packaging material with UV light, so that the cover plate 101 and the substrate 102 form sealing at the protruded frames.

Obviously, in the above method, one row of the second protruded frame 104 may also be manufactured on the cover plate and two rows of the first protruded frames 103 may also be manufactured on the substrate.

Figure 7:
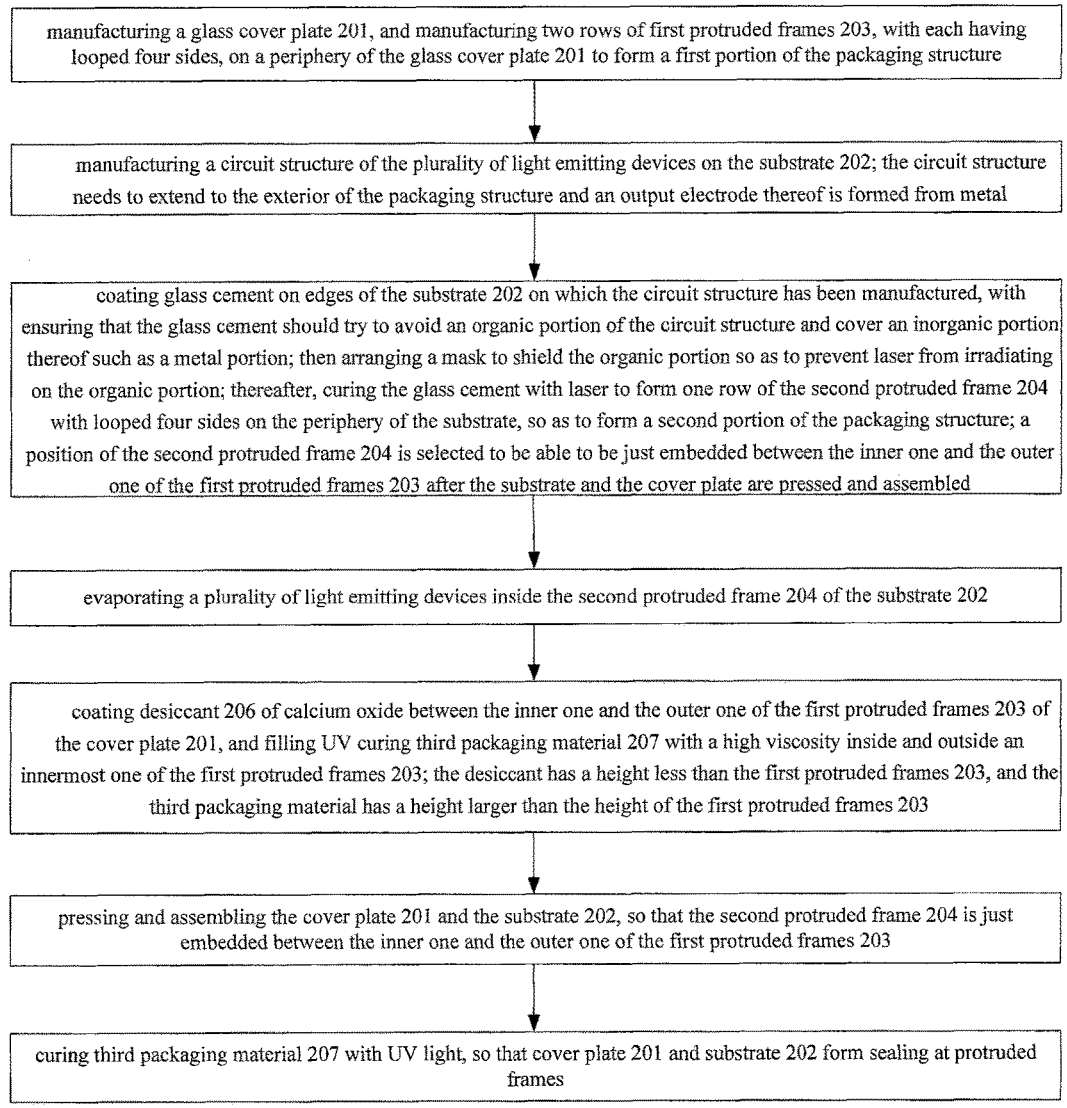
FIG. 7 is a flow chart of a manufacturing method of a light emitting display panel according to another further embodiment of the present disclosure.

FIG. 7 is a flow chart showing a manufacturing method of the light emitting display panel according to another further embodiment of the present disclosure. As shown in FIG. 7, the manufacturing method comprises steps of:

Step S501. manufacturing a glass cover plate 201, and manufacturing two rows of first protruded frames 203, with each having looped four sides, on the periphery of the glass cover plate 201 to form a first portion of the packaging structure.

In the step S501, both an inner one and an outer one of the first protruded frames 203 have a width of 50 μm, a height of 100 μm and a gap of 50 μm.

Step S502. manufacturing a circuit structure of the plurality of light emitting devices on the substrate 202.

Wherein the circuit structure needs to extend to the exterior of the packaging structure and an output electrode thereof is formed from metal.

Step S503. coating glass cement on edges of the substrate on which the circuit structure has been manufactured, with ensuring that the glass cement should try to avoid an organic portion of the circuit structure and cover an inorganic portion thereof such as a metal portion; then arranging a mask to shield the organic portion so as to prevent laser from irradiating on the organic portion; thereafter, curing the glass cement with laser to form one row of the second protruded frame 204 with looped four sides on the periphery of the substrate, so as to form a second portion of the packaging structure.

In the step S503, a position of the second protruded frame 204 is selected to be able to be just embedded between the inner one and the outer one of the first protruded frames 203 after the substrate and the cover plate are pressed and assembled. Wherein, the second protruded frame 204 has a height of 80 μm and a width of 40 μm.

Step S504. forming a plurality of light emitting devices inside the second protruded frame 204 of the substrate 202.

Step S505. coating desiccant of calcium oxide between the inner one and the outer one of the first protruded frames 203 of the cover plate 201, and filling a UV curing third packaging material 207 with a high viscosity inside and outside the innermost one of the first protruded frames 203.

In the step S505, the desiccant has a height less than the first protruded frames 203, and the third packaging material has a height of 110 μm which is larger than the height of the first protruded frames 203.

Step S506. pressing and assembling the cover plate 201 and the substrate 202, so that the second protruded frame 204 is just embedded between the inner one and the outer one of the first protruded frames 203.

Step S507. curing the third packaging material 207 with UV light, so that the cover plate 201 and the substrate 202 form sealing at the protruded frames.

Wherein, the number of the first protruded frames 203 may be more than two and the number of the second protruded frames 204 may be more than one. If the number of the second protrude frames 204 is more than one, the plurality of light emitting devices are always manufactured inside the innermost one of the second protruded frames 204 and the circuit structure thereof extends from an underneath or a surface of the innermost one of the second protruded frames 204 to the exterior of the packaging structure. Moreover, the plurality of second protruded frames 204 may be manufactured before or after the circuit structure of the plurality of light emitting devices is manufactured, and a detailed manufacturing method is the same as the manufacturing method for only one second protruded frame 104.

Because the first and second protruded frames are formed from glass material, the packaging structure according to the embodiments of the present disclosure is able to prolong the invasion path of water vapor and oxygen gas while decreasing an area occupied by the adhesive material, that is, to realize a good performance of preventing water vapor and oxygen gas with ensuring a narrow bezel. If glass cement is used as the protruded frames and a process of curing with laser is performed before manufacturing OLED, a damage to OLED may be decreased and the circuit may not be affected. In addition, the upper surface of the frame is preferably formed as a curved surface, if the circuit structure is paved thereon, the curved surface has a smoother transition and may prevent the circuit from opening. Thus, the above solutions described above have many advantages such as a better sealing performance and a simple manufacturing process.

Specific embodiments described above have explained objectives, technical solutions and advantages of the present disclosure in further detail, as it should be understood that the above description is only the specific embodiment of the present disclosure, but not to limit the present disclosure. Any modifications, equivalents, improvements made within the spirit and principle of the present disclosure should be included within the scope of the present disclosure.

What is claimed is:

1. A light emitting display panel comprising:
a cover plate and a substrate disposed opposite to each other;
a plurality of light emitting devices located between the cover plate and the substrate; and
a packaging structure surrounding the plurality of light emitting devices;
wherein the packaging structure comprises three rows of closed protruded frames and a first packaging material which is located between adjacent protruded frames, each of the protruded frames having four sides, the four sides of each of the protruded frames being looped and the three rows of protruded frames being adjacent to and embedded into each other in an outward direction, and adjacent ones of the three rows of protruded frames are alternately disposed on the cover plate and the substrate and non-adjacent ones of the three rows of protruded frames are disposed on the same one of the cover plate and the substrate; and
wherein the packaging structure further comprises a second packaging material which is located between the cover plate and the substrate, and located outside an outermost one of the three rows of protruded frames and inside an innermost one of the three rows of protruded frames and filled in gaps partially between the cover plate and the substrate.

2. The light emitting display panel of claim 1, wherein the light emitting display panel further comprises a circuit structure of the plurality of light emitting devices, the circuit structure has an inorganic portion and an organic portion, and the circuit structure extends from underneath the protruded frames disposed on the substrate to an exterior of the packaging structure and the protruded frames underneath which the circuit structure extends from are disposed on the inorganic portion of the circuit structure.

3. The light emitting display panel of claim 1, wherein the light emitting display panel further comprises a circuit structure of the plurality of light emitting devices, the circuit structure being paved on a convex surface of the protruded frames disposed on the substrate and extending to an exterior of the packaging structure, and wherein each of the convex surfaces of the protruded frames is a surface with a certain radian.

4. The light emitting display panel of claim 1, wherein the first packaging material comprises desiccant, and the second packaging material comprises UV curing and/or thermal curing resin adhesive.

5. The light emitting display panel of claim 1, wherein, the protruded frames include glass material.

6. The light emitting display panel of claim 1, wherein non-adjacent two rows of the three rows of protruded frames disposed on one of the cover plate and the substrate have the same height, and another row of the three rows of protruded frames, which is disposed on the other one of the cover plate and the substrate and disposed between the non-adjacent two rows in the outward direction, has a height less than the height of non-adjacent two rows, and the another row is spaced from both the non-adjacent two rows in the outward direction.

7. The light emitting display panel of claim 6, wherein each of the three rows of protruded frames has a height of 10 μm to 100 μm and a width of 10 μm to 50 μm.

* * * * *